(12) United States Patent
Ono

(10) Patent No.: US 10,181,340 B2
(45) Date of Patent: Jan. 15, 2019

(54) ELECTRONIC DEVICE AND CONTROL METHOD WITH INSTRUCTION UNITS BASED ON A NUMBER OF POWER SUPPLY OFF OPERATIONS

(71) Applicant: CANON KABUSHIKI KAISHA, Tokyo (JP)

(72) Inventor: Shinichi Ono, Tokyo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 15/654,443

(22) Filed: Jul. 19, 2017

(65) Prior Publication Data

US 2018/0025756 A1   Jan. 25, 2018

(30) Foreign Application Priority Data

Jul. 25, 2016  (JP) .................................. 2016-145623
Apr. 10, 2017  (JP) .................................. 2017-077656

(51) Int. Cl.
*G11C 5/14* (2006.01)
*G06F 1/32* (2006.01)
*G06F 3/12* (2006.01)
*G06F 11/20* (2006.01)
*G06F 1/26* (2006.01)

(52) U.S. Cl.
CPC .............. *G11C 5/14* (2013.01); *G06F 1/3268* (2013.01); *G06F 1/3284* (2013.01); *G06F 1/3287* (2013.01); *G06F 3/1221* (2013.01); *G11C 5/143* (2013.01); *G11C 5/148* (2013.01); *G06F 1/266* (2013.01); *G06F 11/2015* (2013.01)

(58) Field of Classification Search
CPC .......... G11C 5/14; G06F 1/3268; G06F 1/266
USPC .......................................................... 365/226
See application file for complete search history.

(56) References Cited

U.S. PATENT DOCUMENTS 5,835,780 A * 11/1998 Osaki ...................... G06F 1/263
713/300
6,023,109 A *  2/2000 Yang ...................... H02J 7/0024
307/63

FOREIGN PATENT DOCUMENTS

JP   2008-114571 A   5/2008

* cited by examiner

*Primary Examiner* — Harry W Byrne
(74) *Attorney, Agent, or Firm* — Canon U.S.A., Inc. IP Division

(57) ABSTRACT

An electronic device includes a storage device and a plurality of instruction units. The plurality of instruction units respectively instruct to turn off a power supply of the storage device. At least one instruction unit among the plurality of instruction units instructs to turn off power supply to the storage device in accordance with a total of the number of power supply off operations for the storage device respectively instructed by the plurality of instruction units.

15 Claims, 10 Drawing Sheets

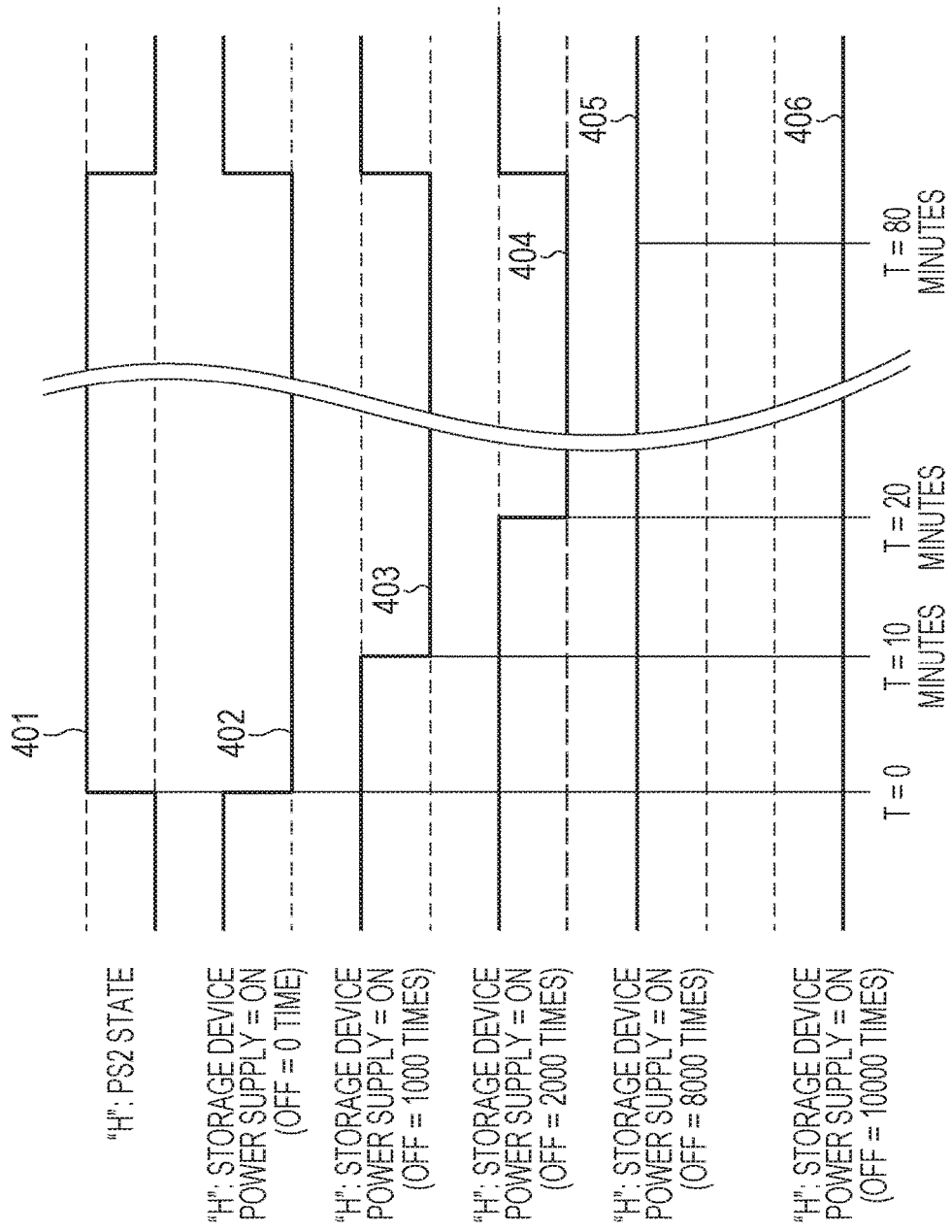

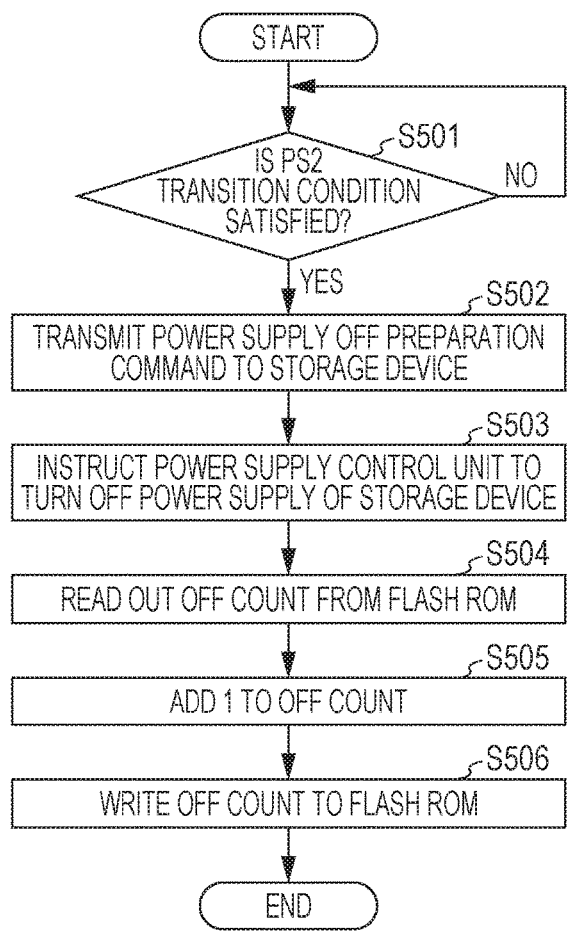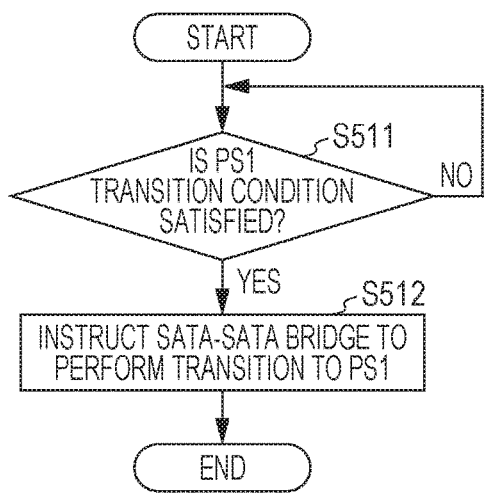

ELECTRONIC DEVICE AND CONTROL METHOD WITH INSTRUCTION UNITS BASED ON A NUMBER OF POWER SUPPLY OFF OPERATIONS

BACKGROUND OF THE INVENTION

Field of the Invention

One disclosed aspect of the embodiments relates to an electronic device and a control method for the electronic device.

Description of the Related Art

An upper limit is set on the number of turning on/off operations for a power supply of a hard disc drive (HDD) because of durability. For this reason, when the HDD is used, it is important that the operations do not exceed the upper limit of the turning on/off operations for the power supply. On the other hand, due to an increase in demands for power saving in recent days, it is desired that the HDD power supply is more frequently turned off for a purpose of suppressing power consumption in an image forming apparatus. In view of the above, in order that the operations do not exceed the upper limit of the turning on/off operations while turning-off of the HDD power supply is more frequently performed, a management method for the number of turning-off operations is needed. On the other hand, the upper limit of the turning on/off operations for the power supply due to the durability reason is not set on a solid state drive (SSD), and the management for the number of turning-off operations is not needed. A management method for the number of turning on/off operations for the power supply of the HDD includes a method of controlling on/off of the power supply of the HDD from a single control apparatus and counting the number of turning-off operations at this time (for example, see Japanese Patent Laid-Open No. 2008-114571).

SUMMARY OF THE INVENTION

An electronic device exemplified in the disclosure includes a storage device and a plurality of instruction units that respectively instruct to turn off a power supply of the storage device, in which at least one instruction unit among the plurality of instruction units instructs to supply power to the storage device in accordance with a total of the number of power supply off operations for the storage device respectively instructed by the plurality of instruction units.

Further features of the present invention will become apparent from the following description of exemplary embodiments with reference to the attached drawings.

BRIEF DESCRIPTION OF THE DRAWINGS

FIG. 4 is a timing chart illustrating an example of a life extension control method.

FIGS. 5A and 5B are flow charts illustrating a transition process example of power states.

DESCRIPTION OF THE EMBODIMENTS

Figure 1:
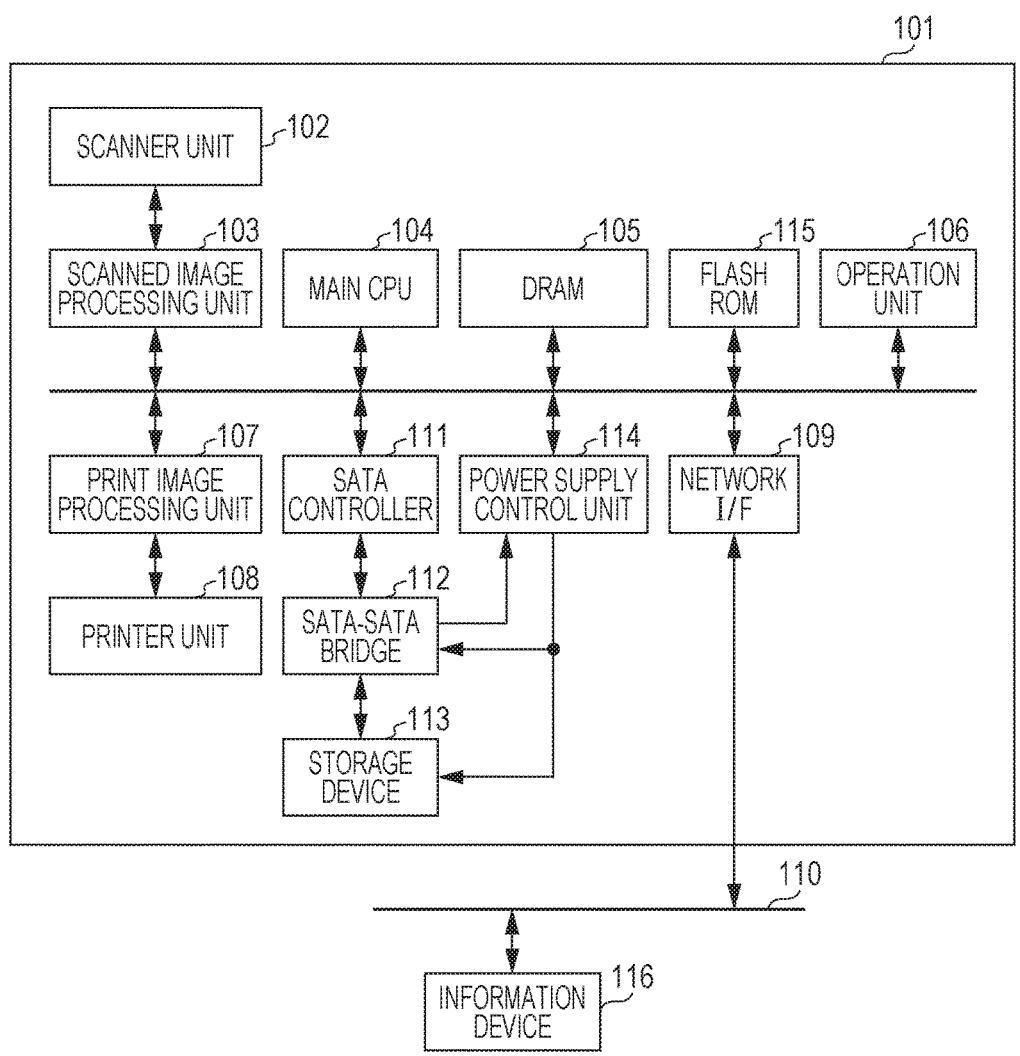
FIG. 1 illustrates a configuration example of an image forming apparatus.

FIG. 1 illustrates a configuration example of an image forming system according to an exemplary embodiment. The image forming system includes an image forming apparatus (electronic device) 101 and an information device 116. According to the present exemplary embodiment, the image forming apparatus 101 will be described as an example of an electronic device configured to perform control on a power supply off count (the number of times the power supply is turned off) for a storage device. It should be noted that, unless particularly specified, the image forming apparatus 101 may be a standalone device or may be a system constituted by a plurality of devices as long as a function of the present exemplary embodiment can be executed.

After image processing is performed on image data input from a scanner unit 102 or a network interface (I/F) 109, the image forming apparatus 101 prints the image data on a sheet by a printer unit 108 to be output. In addition, after the image processing is performed on the image data input from the scanner unit 102, the image forming apparatus 101 transmits the image data to the information device 116 by the network I/F 109. The scanner unit 102 optically reads image information on a sheet to be converted into image data of electric signals and then transmits the image data to a scanned image processing unit 103. The scanned image processing unit 103 performs image processing on the image data received from the scanner unit 102 and transmits the image data to an SATA controller 111. A main central processing unit (CPU) 104 governs control of the entirety of the image forming apparatus 101. A dynamic random access memory (DRAM) 105 stores a control program executed by the main CPU 104 and is also used a work area for temporary data. An operation unit 106 notifies a user of information of the image forming apparatus 101 and also accepts an operation from the user. A print image processing unit 107 performs image processing on the received image data and then transmits the image data to the printer unit 108. The printer unit 108 prints the image data received from the print image processing unit 107 on a sheet to be output. The network I/F 109 is an interface configured to perform a communication with the information device 116 via a local area network (LAN) 110. The LAN 110 is a communication network for performing a communication between the image forming apparatus 101 and the information device 116. The LAN 110 herein may take any physical connection forms such as a wired connection and a wireless connection. The SATA controller 111 controls peripheral devices in conformity to Serial ATA (SATA) standard and also performs data transmission and reception between the peripheral devices. An SATA-SATA bridge 112 is a control unit configured to pass a communication between the SATA controller 111 and a storage device 113 and control a power supply of the storage device 113. The storage device 113 is a hard disc drive (HDD) or a solid state drive (SSD). It should be noted that the HDD and the SSD may exist in a mixed manner in the storage device 113. Since the HDD has a life in terms of a power supply on/off count, management of the power supply on/off count needs to be performed. This is because lives of a relay circuit, a drive motor, a magnetic head, and peripheral parts in the HDD are affected by the number of the turning on/off operations of the HDD. In contrast to this, with regard to the SSD, since the life of the power supply on/off count is hardly affected, the management of the power supply on/off count does not need to be performed in principle. Hereinafter, descriptions will be given of a management method of the power supply on/off count for the storage device 113 in a case where the storage device 113 is the HDD. The storage device 113 records data in an internal recording medium and also reads out the data from the internal recording medium in accordance with instructions of the SATA controller 111 and the SATA-SATA bridge 112. A power supply control unit 114 governs power supply control of the entirety of the image forming apparatus 101. A flash ROM 115 stores a program executed by the main CPU 104 and setting information. The information device 116 performs a communication with the image forming apparatus 101 via the LAN 11. The information device 116 transmits the print job and also receives the scanned image from the image forming apparatus 101. The main CPU 104 counts the number of the power supply off operations for the storage device (HDD) 113 and writes the counted number of the power supply off operations for the storage device (HDD) 113 to the flash ROM 115. The phrase "power supply off operations" refer to the operations that turn off the power supply.

Figure 2:
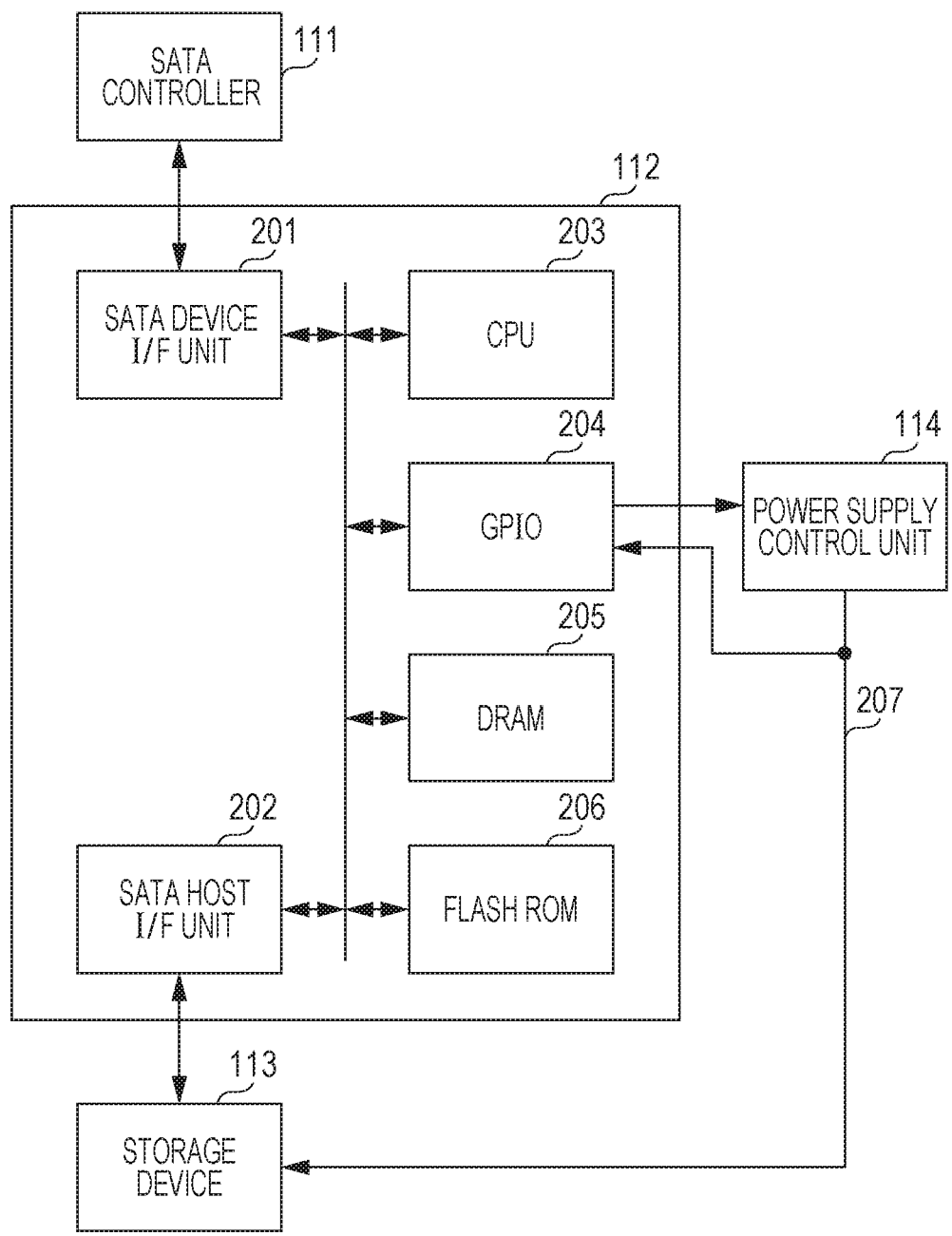
FIG. 2 illustrates a configuration example of an SATA-SATA bridge.

FIG. 2 illustrates a configuration example of the SATA-SATA bridge 112. The SATA-SATA bridge 112 includes an SATA device I/F unit 201, an SATA host I/F unit 202, a CPU 203, a GPIO 204, a DRAM 205, and a flash ROM 206. The SATA device I/F unit 201 operates as the peripheral device in conformity to an SATA standard and performs a communication with the SATA controller 111. The SATA host I/F unit 202 controls the storage device 113 in conformity to the SATA standard and also performs data transmission and reception with the storage device 113. A central processing unit (CPU) 203 governs control of the entirety of the SATA-SATA bridge 112. A general purpose input/output (GPIO) 204 performs signal transmission and reception with the power supply control unit 114 in accordance with instructions of the CPU 203. The DRAM 205 stores a control program executed by the CPU 203 and is also used a work area for temporary data. The flash ROM 206 stores a program executed by the CPU 203 and the setting information. The power supply off count of the storage device (HDD) 113 which is counted by the CPU 203 is written to the flash ROM 206. A storage device power supply line 207 supplies power from the power supply control unit 114 to the storage device 113. In addition, the GPIO 204 detects a state of the storage device power supply line 207.

Figure 3:
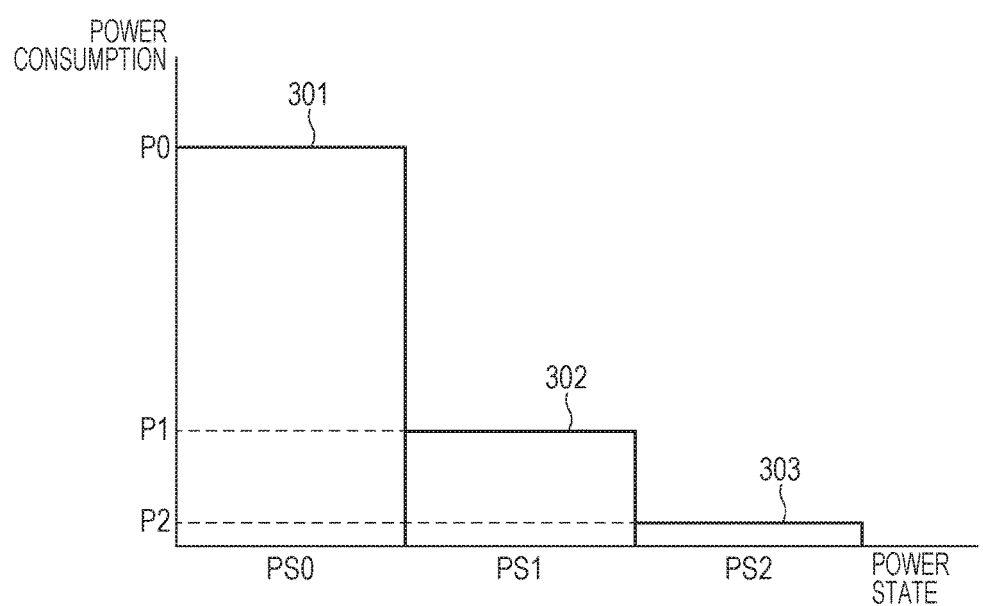
FIG. 3 illustrates power state examples of the image forming apparatus.

FIG. 3 illustrates power states of the image forming apparatus 101. In a state 301, the image forming apparatus 101 is in a power state PS0 and consumes power P0. In a state 302, the image forming apparatus 101 is in a power state PS1 and consumes power P1 that is lower than the power P0 since the power supply is not performed to the scanner unit 102 and the printer unit 108. In a state 303, the image forming apparatus 101 is in a power state PS2 and consumes power P2 that is lower than the power P1 since the power supply is not performed except for the power supply to the network I/F 109.

The image forming apparatus 101 is put into the power state PS0 at the time of a regular operation. In a case where a predetermined condition is satisfied in the power state PS0, the image forming apparatus 101 performs transition to the power state PS1. Furthermore, in a case where a predetermined condition is satisfied in the power state PS1, the image forming apparatus 101 performs transition to the power state PS2. Herein, the predetermined condition includes a case where a print job is not received via the network I/F 109 for a certain period of time, a case where the operation unit 106 does not receive an operation from the user for a certain period of time, and the like.

On the other hand, in a case where a predetermined condition is satisfied in the power state PS2 or PS1, the image forming apparatus 101 performs transition to the power state PS0. Herein, the predetermined condition includes a case where the network I/F 109 receives a magic packet, a case where the operation unit 106 receives an operation from the user, and the like.

In the power state PS0, regular power is supplied to all of modules in the image forming apparatus 101. In the power state PS1, the power supply to the scanner unit 102, the scanned image processing unit 103, the printer unit 108, the print image processing unit 107, and the flash ROM 115 is stopped. Power that is lower than the regular power is supplied to the main CPU 104, the DRAM 105, the power supply control unit 114, the SATA controller 111, the SATA-SATA bridge 112, and the operation unit 106 to enter a standby state. The regular power is supplied to the network I/F 109 to keep a state in which a packet transmitted from the information device 116 can be received. When a power saving transition condition set in the SATA-SATA bridge 112 is to turn off the power supply of the storage device, the storage device 113 stops the power supply. When the power saving transition condition is not the above-described condition, power that is lower than the regular power is supplied to enter the standby state.

In the power state PS2, power that is lower than the regular power to such an extent that the magic packet can be received is supplied to the network I/F 109 in addition to the operations in the power state PS1. The power supply to the storage device 113 is also stopped.

FIG. 4 is a timing chart illustrating an example of a life extension control method for the storage device 113 and illustrating the power state PS2 and power supply off timings of the storage device 113. Hereinafter, a control method for the image forming apparatus 101 will be described. A high level of a PS2 state signal 401 indicates the power state PS2, and a low level indicates the power state PS0 or PS1. As indicated by the PS2 state signal 401, since the predetermined condition is satisfied at a time T=0 minutes, transition from the power state PS1 to the power state PS2 is performed. Thereafter, the predetermined condition is satisfied, and transition from the power state PS2 to the power state PS0 is performed.

The high level of storage device power supply signals 402 to 406 indicates that the power supply of the storage device 113 is on, and the low level indicates that the power supply of the storage device 113 is off. The storage device power supply signal 402 is a signal indicating a timing at which the power supply of the storage device 113 is turned off in a case where the power supply off count of the storage device 113 is 0 time, and the power supply of the storage device 113 is turned off at the same timing as the PS2 state signal 401.

That is, the power supply of the storage device 113 is turned off in the case of the power state PS2, and the power supply of the storage device 113 is turned on in the case of the power state PS0 or PS1.

The storage device power supply signal 403 is a signal indicating a timing at which the power supply of the storage device 113 is turned off in a case where the power supply off count of the storage device 113 is 1000 times, and the power supply of the storage device 113 is turned off at a timing of T=10 minutes that is delayed by 10 minutes from the storage device power supply signal 402. The storage device power supply signal 404 is a signal indicating a timing at which the power supply of the storage device 113 is turned off in a case where the power supply off count of the storage device 113 is 2000 times, and the power supply of the storage device 113 is turned off at a timing of T=20 minutes that is delayed by 10 minutes from the storage device power supply signal 403.

The storage device power supply signal 405 is a signal indicating a timing at which the power supply of the storage device 113 is turned off in a case where the power supply off count of the storage device 113 is 8000 times, and the power supply of the storage device 113 is not turned off even the state is put into the power state PS2. In a case where the storage device 113 is the HDD, the storage device 113 has an upper limit of the on/off count of the power supply and is not used beyond the upper limit. This state corresponds to the life of the storage device (HDD) 113. In order that the on/off count of the power supply of the storage device (HDD) 113 does not exceed the upper limit during the service life of the image forming apparatus 101, the life extension control for the storage device (HDD) 113 needs to be performed. The number of the power supply off operations for the storage device (HDD) 113 is counted, and the time when the power supply of the storage device (HDD) 113 is turned off is delayed from the starting time T=0 minutes for the power state PS2 in accordance with the count. Then, in a case where the state is still the power state PS2 at the time after the delay, the power supply of the storage device (HDD) 113 is eventually turned off. In addition, when the counted number of the power supply off operations for the storage device (HDD) 113 approaches the upper limit of the turning on/off operations for the HDD, processing is performed in which the power supply of the storage device (HDD) 113 is not turned off even when the state is put into the power state PS2.

FIG. 4 illustrates a case where the upper limit of the turning on/off operations for the power supply of the storage device (HDD) 113 is 10000 times, and 10 minutes are added to the delay time until the power supply of the storage device (HDD) 113 is turned off every 1000 times of the power supply off count of the storage device (HDD) 113. As in the storage device power supply signal 405, in a case where the power supply off count of the storage device (HDD) 113 is 8000 times or higher, it is determined that the count approaches the upper limit of the turning on/off operations for the power supply of the HDD. In this case, the power supply of the storage device (HDD) 113 is not turned off even at the time T=80 minutes after the elapse of the delay time from the starting time T=0 minutes for the power state PS2. As in the storage device power supply signal 406, in a case where the power supply off count of the storage device (HDD) 113 is 10000 times or higher, it is determined that the count exceeds the upper limit of the turning on/off operations for the power supply of the HDD. Even when the power supply of the image forming apparatus 101 is turned on, the power supply of the storage device (HDD) 113 is not turned on. It should be noted however that this life extension control for the storage device (HDD) 113 is aimed at the power supply off operations for the storage device (HDD) 113 for the purpose of power saving, and in a case where the power supply of the image forming apparatus 101 is turned off, the power supply of the storage device (HDD) 113 is of course turned off.

FIG. 5A is a flow chart illustrating transition process to the power state PS2 in the main CPU 104. In step S501, the main CPU 104 determines whether or not the transition condition to the power state PS2 is satisfied. In a case where the transition condition to the power state PS2 is satisfied, the processing proceeds to step S502. In FIG. 4, the transition condition is satisfied at the time T=10 minutes in the case of the storage device power supply signal 403, and the transition condition is satisfied at the time T=20 minutes in the case of the storage device power supply signal 404. In step S502, the main CPU 104 transmits a command for causing the storage device 113 to prepare for turning off the power supply via the SATA controller 111 and the SATA-SATA bridge 112. Next, in step S503, the main CPU 104 is an instruction unit configured to instruct the power supply control unit 114 to turn off the power supply of the storage device 113. Next, in step S504, the main CPU 104 reads out the power supply off count of the storage device 113 from the flash ROM 115. Next, in step S505, the main CPU 104 adds 1 to the power supply off count of the storage device 113. That is, the main CPU 104 counts the number of the instructed power supply off operations for the storage device 113. Next, in step S506, the main CPU 104 writes the number of the power supply off operations for the storage device 113 to the flash ROM 115. The power supply off count of the storage device 113 counted by the main CPU 104 is stored in the flash ROM 115, and the life extension control of the storage device 113 is performed by using this value as a reference.

FIG. 5B is a flow chart illustrating transition process to the power state PS1 in the main CPU 104. In step S511, the main CPU 104 determines whether or not the transition condition to the power state PS1 is satisfied. In a case where the transition condition to the power state PS1 is satisfied, the processing proceeds to step S512. In step S512, the main CPU 104 transmits a command for instructing the transition to the power state PS1 to the SATA-SATA bridge 112 via the SATA controller 111.

Figure 6:
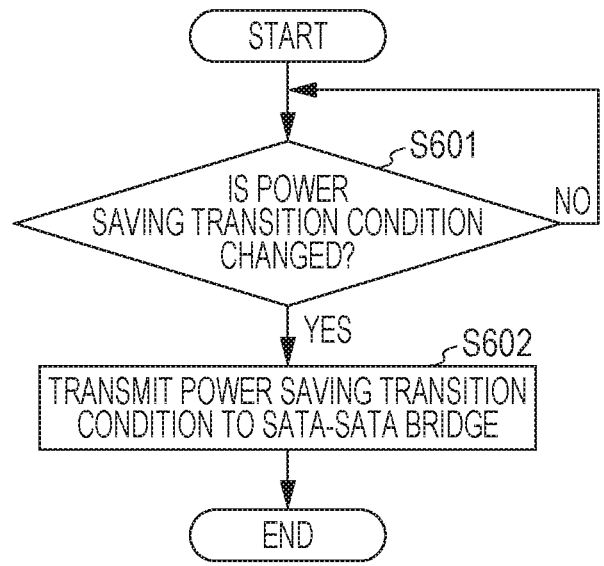
FIG. 6 is a flow chart illustrating a setting processing example of a power transition condition.

FIG. 6 is a flow chart illustrating setting processing of the power transition condition in the main CPU 104. In step S601, the main CPU 104 determines whether or not a power saving transition condition at the time of an initialization or in a power saving state is changed. In a case where the power saving transition condition is changed, the processing proceeds to step S602. In step S602, the main CPU 104 transmits the power saving transition condition to the SATA-SATA bridge 112 via the SATA controller 111.

Figure 7:
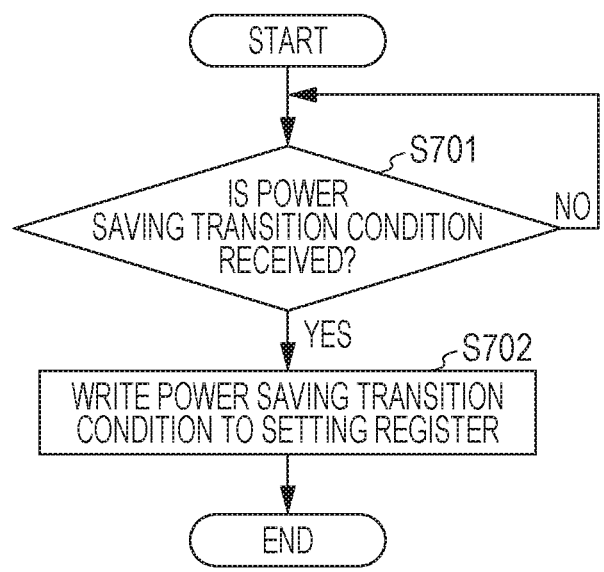
FIG. 7 is a flow chart illustrating processing for the power transition condition.

FIG. 7 is a flow chart illustrating processing for the power transition condition in the SATA-SATA bridge 112. In step S701, the SATA-SATA bridge 112 determines whether or not the power saving transition condition is received from the main CPU 104. In a case where the power saving transition condition is received, the processing proceeds to step S702. In step S702, the SATA-SATA bridge 112 writes the power saving transition condition to a setting register in the CPU 203.

The power saving transition condition includes the transition condition to the power state PS2 in step S501 of FIG. 5A and the transition condition to the power state PS1 in step S511 of FIG. 5B. In addition, the power saving transition condition includes the condition for the power supply of the storage device 113 in the power states PS0 and PS1. For example, the power saving transition condition is a condition on whether the power supply of the storage device 113 is turned off or is not turned off when various conditions are satisfied, for example. In a case where the on/off count of the power supply of the storage device (HDD) 113 approaches the upper limit, when a setting is made in which the power supply of the storage device (HDD) 113 is not turned off, it is possible to set that turning-off of the power supply of the storage device (HDD) 113 for the purpose of the power saving is not performed.

As one example of the above-described various conditions, the power supply of the storage device (HDD) 113 is turned off in a case where the power supply off of the storage device (HDD) 113 is set in the setting register in the CPU 203 and also the count has an allowance to the upper limit of the turning on/off operations for the power supply of the storage device (HDD) 113. It should be noted that the case where the count has the allowance to the upper limit includes a state in which the power supply off count of the storage device (HDD) 113 is 2000 times as in the storage device power supply signal 404 in FIG. 4. Whether or not the count has the allowance to the upper limit of the turning on/off operations for the power supply of the storage device (HDD) 113 may be determined by setting a number in which some margin is taken into account from the upper limit of the turning on/off operations for the power supply of the storage device (HDD) 113 as a threshold to determine whether or not the count exceeds the threshold.

In a case where the power supply off of the storage device (HDD) 113 is set in the setting register in the CPU 203 and also the count approaches the upper limit of the turning on/off operations for the power supply of the storage device (HDD) 113, the power supply of the storage device (HDD) 113 remains on without being turned off. It should be noted that the case where the count approaches the upper limit of the turning on/off operations includes a state in which the power supply off count of the storage device (HDD) 113 is 8000 times as in the storage device power supply signal 405 in FIG. 4, for example.

In a case where the power supply on of the storage device 113 is set in the setting register in the CPU 203, the power supply of the HDD 113 remains on instead of being turned off irrespective of the on/off count of the power supply of the storage device 113.

In addition, although the life extension control of the storage device (HDD) 113 is performed, in some cases, the count reaches the upper limit of the turning on/off operations for the power supply of the storage device (HDD) 113 or higher since the power supply of the image forming apparatus 101 is turned on/off. In this case, the power supply of the storage device (HDD) 113 is not turned on any more, and the state of the storage device (HDD) 113 is maintained. The case where the count reaches the upper limit of the turning on/off operations for the power supply of the storage device (HDD) 113 or higher includes a state in which the power supply off count of the storage device (HDD) 113 is 10000 times as in the storage device power supply signal 406 in FIG. 4, for example. When this state is established, the storage device (HDD) 113 is not activated, and the function of the image forming apparatus 101 is realized. Therefore, the user is promptly notified via the operation unit 106 or the network I/F 109 that the storage device (HDD) 113 should be replaced or the data should be copied.

Figure 8:
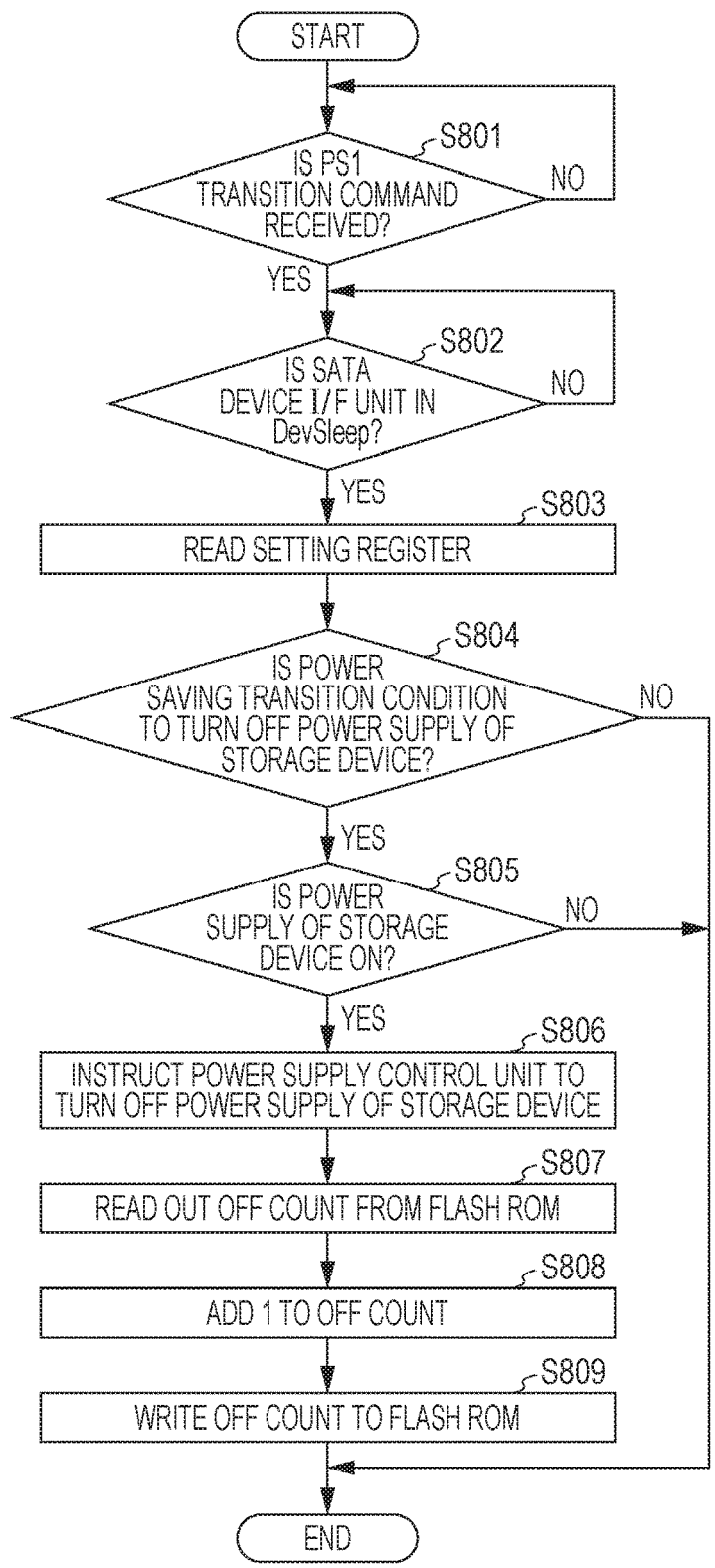
FIG. 8 is a flow chart illustrating an example of storage device power supply off processing.

FIG. 8 is a flow chart illustrating power supply off processing of the storage device 113 in the SATA-SATA bridge 112. In step S801, the SATA-SATA bridge 112 determines whether or not a transition command to the power state PS1 is received from the main CPU 104. In a case where the transition command is received, the processing proceeds to step S802. In step S802, when the SATA-SATA bridge 112 receives a DevSleep command from the main CPU 104, the SATA device I/F unit 201 is put into a DevSleep state. The SATA-SATA bridge 112 determines whether or not the SATA device I/F unit 201 is in the DevSleep state. In a case where the SATA device I/F unit 201 is in the DevSleep state, the processing proceeds to step S803. In step S803, the CPU 203 of the SATA-SATA bridge 112 reads out the power saving transition condition from the setting register in the CPU 203.

Next, in step S804, the SATA-SATA bridge 112 determines whether or not the power saving transition condition is the power supply off of the storage device 113. In a case where the SATA-SATA bridge 112 determines that the power saving transition condition is the power supply off of the storage device 113, the processing proceeds to step S805. In a case where the power saving transition condition is power supply on of the storage device 113, the processing is ended. In step S805, the SATA-SATA bridge 112 determines whether or not the power supply of the storage device 113 is on. Specifically, the CPU 203 determines whether or not the storage device power supply line 207 is at a power supply potential level via the GPIO 204. In a case where the SATA-SATA bridge 112 determines that the power supply of the storage device 113 is on, the processing proceeds to step S806. In a case where the power supply of the storage device 113 is off, the processing is ended. In step S806, the CPU 203 is an instruction unit configured to instruct the power supply control unit 114 to turn off the power supply of the storage device 113 via the GPIO 204. Next, in step S807, the CPU 203 reads out the power supply off count of the storage device 113 from the flash ROM 206. Next, in step S808, the CPU 203 adds 1 to the power supply off count of the storage device 113. That is, the CPU 203 counts the number of the instructed power supply off operations for the storage device 113. Next, in step S809, the CPU 203 writes the power supply off count of the storage device 113 to the flash ROM 206. Herein, the power supply off count of the storage device 113 written to the flash ROM 206 is a temporary count in a case where the power supply of the storage device 113 is turned off by the instruction of the SATA-SATA bridge 112.

Figure 9:
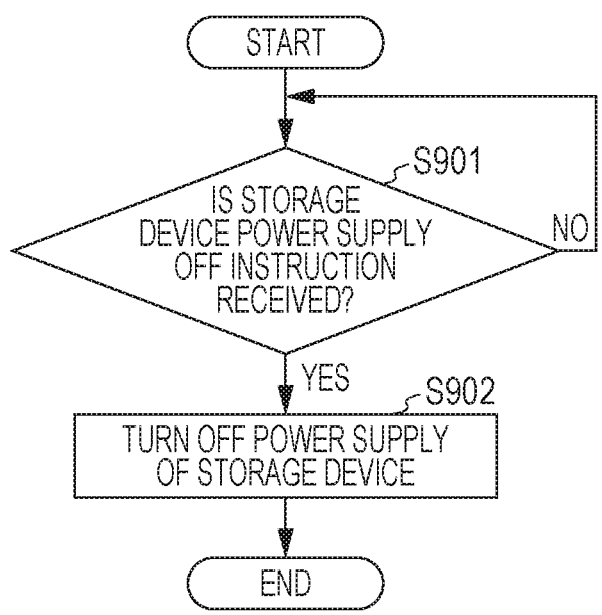
FIG. 9 is a flow chart illustrating an example of the storage device power supply off processing.

FIG. 9 is a flow chart illustrating storage device power supply off processing of the power supply control unit 114. In step S901, the power supply control unit 114 determines whether or not an instruction of turning off the power supply of the storage device 113 is received from the main CPU 104 or the SATA-SATA bridge 112. In a case where the instruction of turning off the power supply of the storage device 113 is received, the processing proceeds to step S902. In step S902, the power supply control unit 114 turns off the power supply of the storage device 113.

Figure 10:
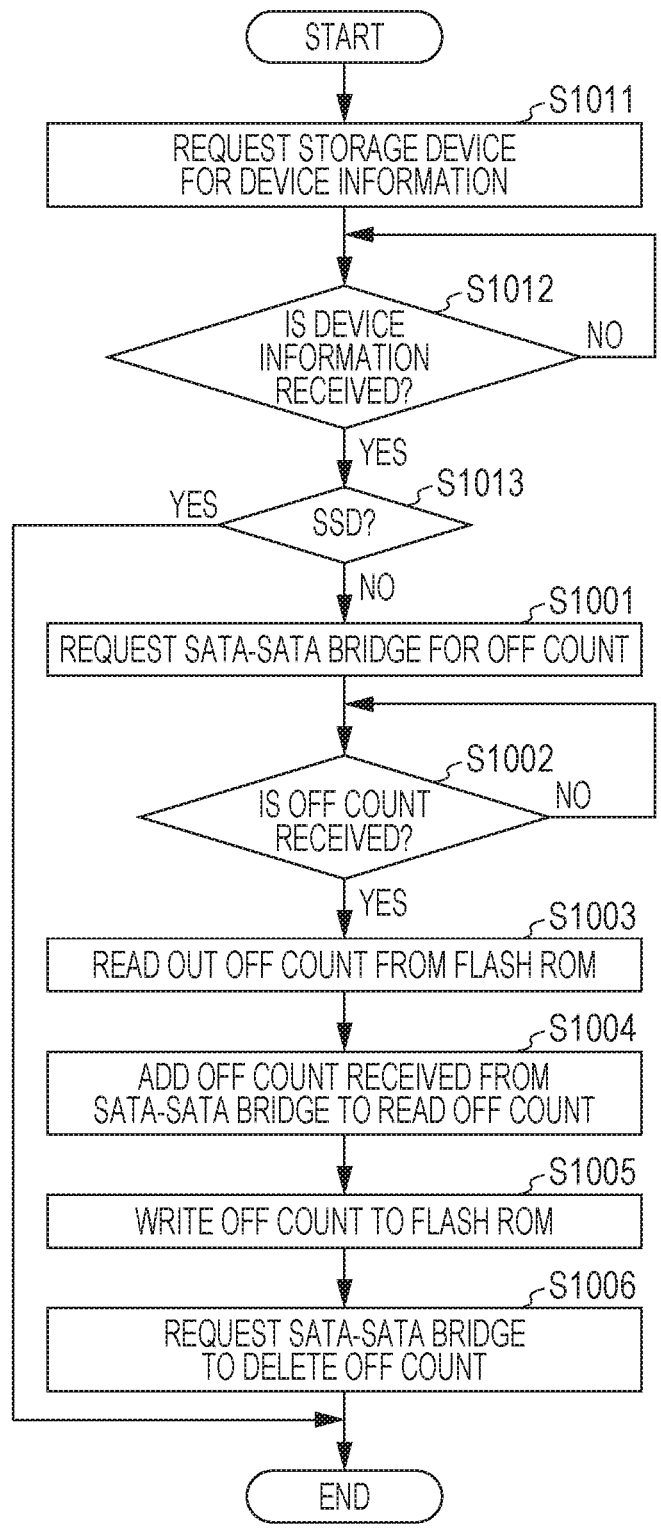
FIG. 10 is a flow chart illustrating an example of power supply off count request processing.

FIG. 10 is a flow chart illustrating power supply off count request processing in the main CPU 104. In step S1011, the main CPU 104 requests the storage device 113 for device information indicating a type of the storage device 113. Next, the main CPU 104 waits until the device information from the storage device 113 is received, and in a case where the device information from the storage device 113 is received, the processing proceeds to step S1013. In step S1013, the main CPU 104 determines whether the storage device 113 is one of the HDD and the SSD on the basis of the received device information. In a case where the main CPU 104 determines that the storage device 113 is the HDD, the processing proceeds to step S1001. In a case where the storage device 113 determines that the storage device 113 is the SSD, the processing is ended. It should be noted that the processing from S1011 to S1013 is optional. The processing may start from S1001. For example, after the power supply is turned on, the processing may start from S1001. The HDD is an example of a magnetic and magnetic-system storage device. The SSD is an example of a semiconductor storage device.

In step S1001, the main CPU 104 requests the SATA-SATA bridge 112 for the power supply off count of the storage device (HDD) 113. The request for the power supply off count is performed by using an SATA command. Next, in step S1002, the main CPU 104 determines whether or not the power supply off count of the storage device (HDD) 113 is received from the SATA-SATA bridge 112. In a case where the off count is received, the processing proceeds to step S1003. In step S1003, the main CPU 104 reads out the power supply off count of the storage device (HDD) 113 from the flash ROM 115. Next, in step S1004, the main CPU 104 adds (combines) the power supply off count of the storage device (HDD) 113 received from the SATA-SATA bridge 112 to the power supply off count of the storage device (HDD) 113 read out from the flash ROM 115. Next, in step S1005, the main CPU 104 writes the power supply off count of the storage device (HDD) 113 after the addition to the flash ROM 115. Next, in step S1006, the main CPU 104 requests the SATA-SATA bridge 112 for deletion of the power supply off count of the storage device (HDD) 113. Eventually, the off count written to the flash ROM 115 is a value obtained by combining the power supply off counts of the storage device (HDD) 113 based on the instructions of both the main CPU 104 and the SATA-SATA bridge 112 with each other.

The life extension control for the storage device (HDD) 113 described with reference to FIG. 4 is executed by the main CPU 104 on the basis of the off count recorded in the flash ROM 115. A timing for requesting the off count may be periodical polling or a timing when the main CPU 104 detects the transition of the power saving state of the SATA-SATA bridge 112.

Figure 11:
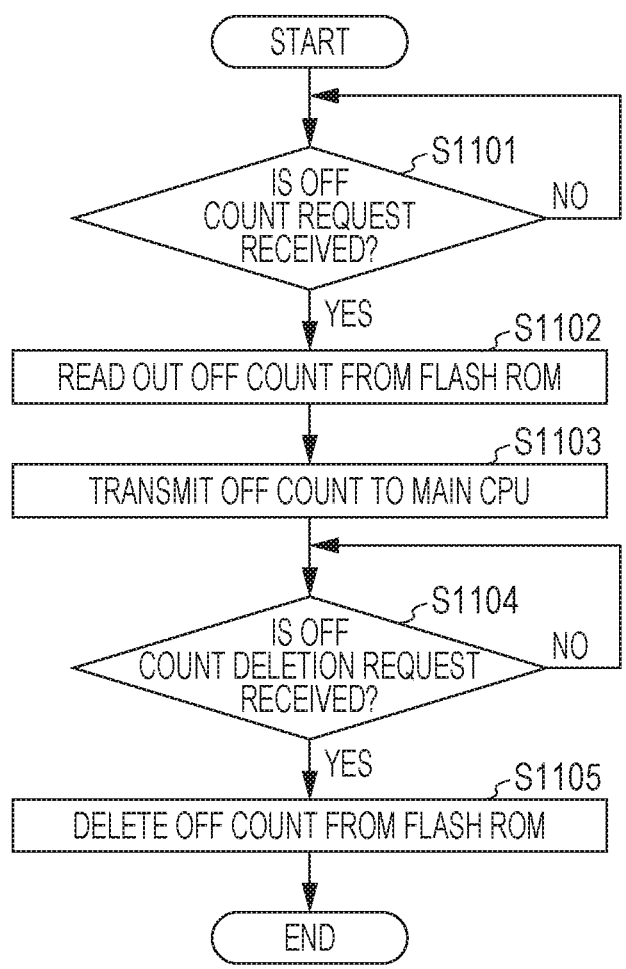
FIG. 11 is a flow chart illustrating an example of power supply off count response processing.

FIG. 11 is a flow chart illustrating power supply off count response processing in the SATA-SATA bridge 112. In step S1101, the SATA-SATA bridge 112 determines whether or not the request for the power supply off count of the storage device 113 is received from the main CPU 104. In a case where the request is received, the processing proceeds to step S1102. In step S1102, the CPU 203 reads out the power supply off count of the storage device 113 from the flash ROM 206. Next, in step S1103, the CPU 203 transmits the power supply off count of the storage device 113 to the main CPU 104. Next, in step S1104, the SATA-SATA bridge 112 determines whether or not a deletion request of the power supply off count of the storage device 113 is received from the main CPU 104. In a case where the deletion request is received, the processing proceeds to step S1105. In step S1105, the CPU 203 deletes the power supply off count of the storage device 113 from the flash ROM 206. Since the temporary off count in a case where the power supply of the storage device 113 is turned off is recorded in the flash ROM 206 by the instruction of the SATA-SATA bridge 112, the off count becomes unnecessary after being transmitted to the main CPU 104, and the off count is deleted to be reset.

As described above, in a case where the storage device 113 is the HDD, the main CPU 104 adds the number of the off operations for the power supply of the storage device (HDD) 113 by the SATA-SATA bridge 112 to the number of the off operations for the power supply of the storage device (HDD) 113 by the main CPU 104. The main CPU 104 controls turning-off of the power supply of the storage device (HDD) 113 in accordance with the number of the off operations after the addition. With this configuration, it is possible to avoid a state in which the counted value of the number of the power supply off operations for the storage device (HDD) 113 becomes lower than the actual number of the off operations. As a result, it is possible to avoid the occurrence of the situation where the number of the off operations unexpectedly exceeds the upper limit of the turning on/off operations for the power supply of the storage device (HDD) 113.

On the other hand, in a case where the storage device 113 is the SSD, the main CPU 104 does not add the number of the off operations for the power supply of the storage device (SSD) 113 by the SATA-SATA bridge 112. As a result, the influence from the delay of the time until the power supply off operations based on the life extension control is suppressed, and the unnecessary power supply on time is shortened, so that the power saving effect is increased.

That is, the main CPU 104 is a main control unit configured to control a higher-level device of the image forming apparatus 101. The SATA-SATA bridge 112 is a control unit configured to control the storage device 113. When the main CPU 104 is in the power saving state, the SATA-SATA bridge 112 may instruct the storage device 113 to turn off the power supply in some cases. In view of the above, according to the present exemplary embodiment, a situation is avoided where the main CPU 104 does not recognize the instruction of turning off the power supply from the SATA-SATA bridge 112 when the main CPU 104 is in the power saving state.

The main CPU 104 and the SATA-SATA bridge 112 are the plurality of instruction units and respectively instruct to turn off the power supply of the storage device 113. It should be noted that the number of the plurality of instruction units may be three or higher. At least one instruction unit among the plurality of instruction units instructs the supply of the power to the storage device 113 in accordance with the total of the numbers of the power supply off operations for the storage device 113 respectively instructed by the plurality of instruction units.

The plurality of instruction units respectively count the numbers of the instructed power supply off operations for the storage device (HDD) 113. At least one instruction unit among the plurality of instruction units combines the numbers of the power supply off operations for the storage device (HDD) 113 respectively counted by the plurality of instruction units with each other and instructs the supply of the power to the storage device (HDD) 113 in accordance with the combined number of the power supply off operations.

The plurality of instruction units 104 and 112 respectively write the counted number of the power supply off operations for the storage device (HDD) 113 to the plurality of flash ROMs (non-volatile memories) 115 and 206. The at least one instruction unit 104 among the plurality of instructions reads out the numbers of the power supply off operations for the storage device (HDD) 113 respectively counted by the plurality of instruction units from the plurality of flash ROMs 115 and 206. Subsequently, the at least one instruction unit 104 among the plurality of instructions combines the numbers of the power supply off operations for the storage device (HDD) 113 respectively counted by the plurality of instruction units with each other.

The one instruction unit 104 among the plurality of instruction units reads out the numbers of the power supply off operations for the storage device (HDD) 113 respectively counted by the plurality of instruction units from the plurality of flash ROMs 115 and 206. Then, the one instruction unit 104 among the plurality of instruction units combines the numbers of the power supply off operations for the storage device (HDD) 113 respectively counted by the plurality of instruction units with each other. Subsequently, the one instruction unit 104 among the plurality of instruction units performs instructions to write the combined number of the power supply off operations to the flash ROM 115 corresponding to one of the plurality of flash ROMs 115 and 206 and delete the number of the power supply off operations stored in the other flash ROM 206.

In a case where the total of the numbers of the power supply off operations for the storage device (HDD) 113 respectively instructed by the plurality of instruction units is lower than a first threshold (8000 times), the at least one instruction unit 104 among the plurality of instructions issues an instruction to turn off the power supply of the storage device 113 in the power saving mode PS2. This state is illustrated in FIG. 4. In a case where the total of the numbers of the power supply off operations for the storage device (HDD) 113 respectively instructed by the plurality of instruction units is higher than or equal to the first threshold (8000 times), the at least one instruction unit 104 among the plurality of instructions does not instruct to turn off the power supply of the storage device 113 in the power saving mode PS2.

As illustrated in FIG. 4, in a case where the total of the numbers of the power supply off operations for the storage device (HDD) 113 respectively instructed by the plurality of instruction units is higher than or equal to a second threshold (10000 times), the at least one instruction unit 104 among the plurality of instructions does not instruct the power supply on of the storage device (HDD) 113.

The at least one instruction unit 104 among the plurality of instructions varies the time from the starting time of the power saving mode PS2 until the instruction to turn off the power supply of the storage device (HDD) 113 in accordance with the total of the numbers of the power supply off operations for the storage device (HDD) 113 respectively instructed by the plurality of instruction units. This state is illustrated in FIG. 4.

It should be noted that any of the above-described exemplary embodiments are merely specific examples for carrying out the disclosure, and the technical scope of the disclosure is not to be construed in a limited manner by these exemplary embodiments. That is, the disclosure can be carried out in various forms without departing from the technological idea or its main features.

According to the present exemplary embodiment, for example, since the on/off control on the power supply of the HDD is performed from one control apparatus, to perform the more flexible power saving control, when the power supply of the HDD is turned on/off from the plurality of control apparatuses, it is possible to accurately count the number of the off operations.

For example, in a case where a power supply of one HDD is turned off from two control apparatuses A and B, the control apparatus A turns off the power supply of the HDD and counts the number of the off operations in a certain state in some cases. In addition, the control apparatus B turns off the power supply of the HDD but this off operation is not counted in another state in some cases. To remove the problem of these mounting forms, according to another example of the present exemplary embodiment, it is possible to avoid a situation where the counted number of the off operations does not become lower than the actual number of the off operations. According to still another example of the present exemplary embodiment, it is also possible to avoid a situation where the count unexpectedly exceeds the upper limit of the turning on/off operations. In addition, according to another aspect of the present exemplary embodiment, since the SSD has not have the life of the power supply on/off operations, it is possible to provide a management method for the power supply off count which is different from the management method for the HDD.

To summarize the above-described aspects, one purpose of the present exemplary embodiment is to provide the electronic device that can avoid the occurrence of the situation where the power supply off count of the storage device exceeds the upper limit and the control method for the electronic device. In addition, it is possible to avoid the occurrence of the situation where e power supply off count of the storage device exceeds the upper limit.

Other Embodiments

Embodiment(s) of the disclosure can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like. While the disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2016-145623 filed Jul. 25, 2016 and No. 2017-077656 filed Apr. 10, 2017, which are hereby incorporated by reference herein in their entirety.

What is claimed is:

1. An electronic device comprising:
a storage device; and
a plurality of instruction units that respectively instruct to turn off a power supply of the storage device,
wherein at least one instruction unit among the plurality of instruction units instructs to turn off a power supply to the storage device in accordance with a total of the number of power supply off operations for the storage device respectively instructed by the plurality of instruction units.

2. The electronic device according to claim 1,
wherein the plurality of instruction units respectively count the numbers of the instructed power supply off operations for the storage device, and
wherein the at least one instruction unit among the plurality of instruction units combines the numbers of the instructed power supply off operations for the storage device respectively counted by the plurality of instruction units with each other and instructs to turn off the power supply to the storage device in accordance with the combined number.

3. The electronic device according to claim 2,
wherein the plurality of instruction units respectively write the counted numbers of the power supply off operations for the storage device to a plurality of non-volatile memories, and
wherein the at least one instruction unit among the plurality of instruction units reads out the numbers of the power supply off operations for the storage device respectively counted by the plurality of instruction units from the plurality of non-volatile memories and combines the numbers of the instructed power supply off operations for the storage device respectively counted by the plurality of instruction units with each other.

4. The electronic device according to claim 3, wherein one instruction unit among the plurality of instruction units reads out the numbers of the power supply off operations for the storage device respectively counted by the plurality of instruction units from the plurality of non-volatile memories, combines the numbers of the instructed power supply off operations for the storage device respectively counted by the plurality of instruction units with each other, writes the combined number to one non-volatile memory among the plurality of non-volatile memories, and deletes the number stored in the other non-volatile memory.

5. The electronic device according to claim 1, wherein the at least one instruction unit among the plurality of instruction units instructs to turn off the power supply of the storage device in a power saving mode in a case where the total of the number of power supply off operations for the storage device respectively instructed by the plurality of instruction units is lower than a first threshold and does not instruct to turn off the power supply of the storage device in the power saving mode in a case where the total of the number of power supply off operations for the storage device respectively instructed by the plurality of instruction units is higher than or equal to the first threshold.

6. The electronic device according to claim 1, wherein the at least one instruction unit among the plurality of instruction units does not instruct to turn on the power supply of the storage device in a case where the total of the number of power supply off operations for the storage device respectively instructed by the plurality of instruction units is higher than or equal to a second threshold.

7. The electronic device according to claim 1, wherein the at least one instruction unit among the plurality of instruction units varies a time when turning-off of the power supply of the storage device is instructed from a starting time of a power saving mode in accordance with the total of the number of power supply off operations for the storage device respectively instructed by the plurality of instruction units.

8. The electronic device according to claim 1,
wherein one instruction unit among the plurality of instruction units is a main control unit configured to control a higher-level device of the electronic device, and
wherein the other instruction unit among the plurality of instruction units is a control unit configured to control the storage device and instruct the storage device to turn off the power supply when the main control unit is in a power saving state.

9. The electronic device according to claim 1, further comprising:
a printing unit configured to perform printing.

10. The electronic device according to claim 1, wherein the at least one instruction unit among the plurality of instruction units counts the numbers of the instructed power supply off operations for the storage device in a case where the storage device is a magnetic-system storage device and does not count the numbers of the instructed power supply off operations for the storage device in a case where the storage device is a semiconductor storage device.

11. A control method for an electronic device including
a storage device, and
a plurality of instruction units that respectively instruct to turn off a power supply of the storage device, the control method comprising:
instructing to turn off a power supply to the storage device by at least one instruction unit among the plurality of instruction units in accordance with a total of the number of power supply off operations for the storage device respectively instructed by the plurality of instruction units.

12. The electronic device according to claim 1, wherein at least one instruction unit among the plurality of instruction units controls a timing for instructing to turn off a power supply to the storage device in accordance with a total of the number of power supply off operations for the storage device respectively instructed by the plurality of instruction units.

13. The electronic device according to claim 1, wherein at least one instruction unit among the plurality of instruction units delays a timing for instructing to turn off a power supply to the storage device in accordance with a total of the number of power supply off operations for the storage device respectively instructed by the plurality of instruction units.

14. An electronic device comprising:
a storage device;
a processor to instruct to control unit to turn off a power supply of the storage device; and
a memory controller to instruct to turn off a power supply of the storage device;
wherein a number of times of turning off instructed by the processor and a number of times of turning off instructed by the memory controller are counted by the same counter and the processor and the memory controller instruct to turn off a power supply in accordance with counting by the counter.

15. A method for controlling a system of an electronic device configured to connect a storage device comprising:
a processor to instruct to control unit to turn off a power supply of the storage device; and
a memory controller to instruct to turn off a power supply of the storage device;

wherein a number of times of turning off instructed by the processor and a number of times of turning off instructed by the memory controller are counted by the same counter and the processor and the memory controller are controlled to instruct to turn off a power supply in accordance with counting by the counter.

* * * * *